(12) United States Patent
Murata et al.

(10) Patent No.: US 6,995,454 B2
(45) Date of Patent: Feb. 7, 2006

(54) SEMICONDUCTOR OPTICAL INTEGRATED DEVICE HAVING A LIGHT EMITTING PORTION, A MODULATION SECTION AND A SEPARATION PORTION

(75) Inventors: Michio Murata, Yokohama (JP); Takeyoshi Masuda, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/354,026

(22) Filed: Jan. 30, 2003

(65) Prior Publication Data

US 2003/0146440 A1    Aug. 7, 2003

(30) Foreign Application Priority Data

Feb. 1, 2002  (JP) ............................ P2002-025828

(51) Int. Cl.
  *H01L 33/00*  (2006.01)
  *H01L 29/26*  (2006.01)
(52) U.S. Cl. .......................... 257/615; 257/79; 257/94; 257/98
(58) Field of Classification Search ................ 257/615, 257/11, 79, 94, 98, 189, 200–201
See application file for complete search history.

(56) References Cited

U.S. PATENT DOCUMENTS 5,721,429 A * 2/1998 Radford et al. .......... 250/338.4
6,021,148 A * 2/2000 Matsumoto et al. .......... 372/50

* cited by examiner

*Primary Examiner*—Thanh Nguyen
(74) *Attorney, Agent, or Firm*—McDermott Will & Emery LLP

(57) ABSTRACT

A semiconductor optical integrated device 1 comprises a light-emitting element portion 110, modulation element portion 120, and separation portion 130 on a substrate 2. Light-emitting element portion 110 comprises a semiconductor laser element portion, and modulation element portion 120 comprises a modulation element portion. Separation portion 130 is formed between light-emitting element portion 110 and modulation element portion 120. In separation portion 130, a semiconductor embedded portion 80e is provided in a second clad layer 8m. Whereas second clad layer 8m consists of p-type InP, semiconductor embedded portion 80e consists of n-type InP. Hence semiconductor embedded portion 80e has the effect of impeding the leakage current flowing between electrodes 90a and 90b. As a result, the leakage current occurring between electrodes 90a and 90b via second clad layer 8m is reduced.

12 Claims, 13 Drawing Sheets

SEMICONDUCTOR OPTICAL INTEGRATED DEVICE HAVING A LIGHT EMITTING PORTION, A MODULATION SECTION AND A SEPARATION PORTION

BACKGROUND OF THE INVENTION

1. Field of the Invention

This invention relates to a semiconductor optical integrated device and a method of manufacture of same.

2. Description of the Related Art

Semiconductor optical integrated devices, in which semiconductor laser diodes and modulators are integrated, are being used in optical communication systems. Within semiconductor optical integrated devices, a semiconductor laser diode (LD) is driven by direct current, and the laser light emitted from the LD is modulated at high speed by an electroabsorption (EA) modulator.

SUMMARY OF THE INVENTION

In a semiconductor optical integrated device with the above configuration, there must be sufficient electrical isolation between LD and EA elements. In general, in an LD, when the injected carrier density changes the emission wavelength fluctuates. If the electrical isolation between LD and EA elements is insufficient, the modulation signal applied to the EA element may cause a change in the LD injected carrier density. Consequently, the laser light emission wavelength fluctuates. When transmitting optical signals over long distances in an optical communication system, such wavelength fluctuations result in distortions in the signal waveform. That is, the signal transmission distance is limited. In order to prevent this, it is important that in the region separating the LD and EA elements (hereinafter referred to as the "separation portion") the resistance (hereinafter referred to as the "separation resistance") be increased.

An injection of protons into the separation portion is known as a method to increase the separation resistance. However, according to the findings of these inventors, when using this method there is the possibility that crystal defects may occur in the portion into which protons are injected.

An object of this invention is to provide a semiconductor optical integrated device comprising a structure enabling reduction of the leakage current between light-emitting elements and modulation elements, and a method of manufacture of same.

A semiconductor optical integrated device of one aspect of this invention comprises: a first semiconductor mesa portion, having an active layer containing a group III-V semiconductor, and extending in a prescribed axial direction; a second semiconductor mesa portion, having an active layer containing a group III-V semiconductor, optically coupled with said first semiconductor mesa portion, and extending in a prescribed axial direction; a first conductivity type group III-V semiconductor layer which is provided on said first and second semiconductor mesa portions, is separated into a first region for a light-emitting element portion, a third region for a modulation element portion and a second region for a separation portion separating said light-emitting portion and said modulation element portion, and has a depression portion in said second region; a first electrode, provided on said first region of said group III-V semiconductor layer, and a second electrode, provided on said third region of said group III-V semiconductor layer; and, a group III-V semiconductor portion, of a second conductivity type differing from said first conductivity type, provided in said depression portion.

A semiconductor optical integrated device with the above configuration has a depression portion in the second region, positioned between the first and third regions of the first conductivity type group III-V semiconductor layer. A second conductivity type group III-V semiconductor portion is provided in this depression portion. This second conductivity type group III-V semiconductor portion serves the purpose of impeding the leakage current flowing between the first and second electrodes. As a result, the leakage current between the first and second electrodes is reduced.

A semiconductor optical integrated device of another aspect of the invention comprises a light-emitting element portion, separation portion, and modulation element portion arranged in a prescribed axial direction, said light-emitting element portion being optically coupled with said modulation element portion via said separation portion; and wherein: said light-emitting element portion, separation portion and modulation element portion each comprises a semiconductor mesa portion, having an active layer containing a group III-V semiconductor extending in a prescribed axial direction; said light-emitting element portion comprises a first electrode on its semiconductor mesa portion; said modulation element portion comprises a second electrode on its semiconductor mesa portion; and, the width of said semiconductor mesa portion of said separation portion is smaller than the width of said semiconductor mesa portion in at least one among said light-emitting element portion and said modulation element portion.

In the above configuration, the width of the semiconductor mesa portion in the separation portion positioned between the light-emitting element portion and the modulation element portion is narrower than the width of the semiconductor mesa portion in at least one among the light-emitting element portion and the modulation element portion. Consequently, the path of the leakage current flowing between the first electrode provided on the light-emitting element portion and the second electrode provided on the modulation element portion is constricted, and the electrical resistance of this path is increased. Hence the leakage current flowing between the first and second electrodes is reduced.

Preferably, the semiconductor optical integrated device further comprises: a first conductivity type group III-V semiconductor layer which is provided on each of said semiconductor mesa portions, is separated into a first region for said light-emitting element portion, a third region for said modulation element portion and a second region for said separation portion, and has a depression portion in said second region; and, a group III-V semiconductor portion, of a second conductivity type differing from said first conductivity type, provided in said depression portion.

As a result, the path of the leakage current flowing between the first and second electrodes is further constricted by the group III-V semiconductor portion. Consequently, the leakage current is further reduced.

It is preferable that said separation portion have an optical guide layer provided on said active layer and a clad layer provided on said optical guide layer, and the bottom of said depression portion is placed within said clad layer.

Because the second conductivity type group III-V semiconductor portion provided in the depression portion penetrate through the first conductivity type group III-V semiconductor layers provided on the first and second semiconductor mesa portions in the separation portion, the leakage current between the first and second electrodes is further reduced. And, because the depression portion does not extend to the optical guide layer, the optical coupling in the optical guide layer of the first and second semiconductor mesa portions is not blocked by the depression portion.

Further, it is preferable that said first conductivity type be the conductivity type opposite said second conductivity type, and the dopant concentration of said second conductivity type group III-V semiconductor portion is less than $5 \times 10^{17}$ cm$^{-3}$.

As a result, a depletion layer is formed at the interface between the second conductivity type group III-V semiconductor portion and the first conductivity type group III-V semiconductor layer. If the impurity concentration in the second conductivity type group III-V semiconductor portion is $5 \times 10^{17}$ cm$^{-3}$ or less, a sufficient thickness can be secured for the depletion layer extending into the second conductivity type group III-V semiconductor portion. Consequently the occurrence of breakdown at the interface is prevented. Hence leakage currents occurring due to breakdown are prevented.

Further, an undoped semiconductor, that is, a group III-V semiconductor which comprises n-type or p-type impurity from the initial time of synthesis, may be employed as the material of second conductivity type group III-V semiconductor portion.

Further, it is preferable that a third electrode be provided on the second conductivity type group III-V semiconductor portion. By this means, a reverse bias is applied to the interface between the second conductivity type group III-V semiconductor portion and the first conductivity type group III-V semiconductor layer below the second electrode. Hence the leakage current flowing between the first and second electrodes via the first conductivity type group III-V semiconductor layer is further reduced.

It is preferable that the above semiconductor optical integrated device further comprise a contact layer for the light-emitting element portion, and a separate contact layer for the modulation element portion. By this means, leakage currents via contact layer are prevented. Also, ohmic-contact electrodes can be easily realized.

Further, it is preferable that the edge of second conductivity type group III-V semiconductor portion be at a distance from the edges of the first and second contact layers. If the edge of second conductivity type group III-V semiconductor portion and edges of first and second contact layers are in contact, there is the possibility that leakage currents may flow between the first and second contact layers via the group III-V semiconductor portion. However, if the edge of second conductivity type group III-V semiconductor portion is at a distance from the edges of first and second contact layers, such leakage currents are prevented.

The method of manufacture of a semiconductor optical integrated device of one aspect of this invention comprises the process (1) of forming, on a substrate, a first and second semiconductor portion, and a third semiconductor portion positioned on the first and second semiconductor portions. In this process, the first semiconductor portion has a semiconductor multilayer structure containing a group III-V semiconductor, and is positioned in a first region of the substrate; the second semiconductor portion has a semiconductor multilayer structure containing a group III-V semiconductor, and is positioned in a second region of the substrate; and the third semiconductor portion is formed to comprise a first conductivity type group III-V semiconductor. This method further comprises a process (2) of forming a depression portion in the third semiconductor portion, a process (3) of forming, in the depression portion, a semiconductor portion comprising a second conductivity type group III-V semiconductor, and a process (4) of forming a semiconductor mesa by etching the first through third semiconductor portions. Here the semiconductor mesa has first through third regions positioned in a prescribed axial direction, and the depression portion is positioned on the second region of the semiconductor mesa.

The method of manufacture of a semiconductor optical integrated device of one aspect of this invention comprises a process (1) of forming, on a substrate, a first and second semiconductor portion, and a third semiconductor portion positioned on the first and second semiconductor portions. In this process, the first semiconductor portion has a semiconductor multilayer structure containing a group III-V semiconductor, and is positioned in a first region of the substrate; the second semiconductor portion has a semiconductor multilayer structure containing a group III-V semiconductor, and is positioned in a second region of the substrate; and the third semiconductor portion comprises a first conductivity type group III-V semiconductor. This method further comprises a process (2) of etching the first through third semiconductor portions to form a semiconductor mesa. Here the semiconductor mesa has first through third regions positioned in a prescribed axial direction, and the width of the second region of the semiconductor mesa is formed with a width smaller than the mesa portion width of at least one among the first and third regions.

It is preferable that the above method further comprise a process of forming a depression portion in the third semiconductor portion, and a process of forming a semiconductor portion comprising a second conductivity type group III-V semiconductor in the depression portion. In the depression portion formation process, the depression portion is formed so as to be positioned over the second region of the semiconductor mesa.

It is preferable that a process of formation of a first electrode on the first region, a second electrode on the semiconductor portion comprising the second conductivity type group III-V semiconductor, and a third electrode on the third region, be further comprised.

It is preferable that a process of formation of a contact film prior to the depression portion formation process be comprised; that a process be comprised in which a mask having an aperture portion above the second region is used to form the contact film and a depression portion in the third semiconductor portion; and the process of semiconductor portion formation comprise a process of formation of a semiconductor portion using a mask.

It is preferable that the process of formation of the depression portion comprise a process of formation of a depression portion in the third semiconductor portion using a mask having an aperture portion above the second region, and that the process of semiconductor portion formation comprise a process of formation of a semiconductor portion using a mask.

DESCRIPTION OF THE PREFERRED EMBODIMENTS

Figure 1A:
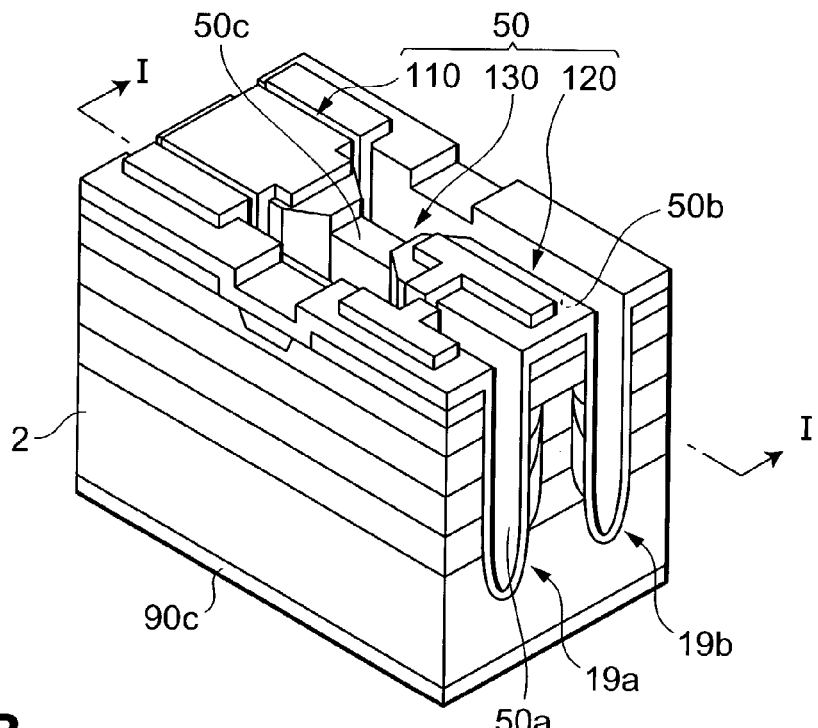
FIG. 1A is a perspective view of the semiconductor optical integrated device of a first aspect.

Below, preferred aspects of the semiconductor optical integrated devices of this invention are explained, referring to the drawings. In the explanations of the drawings, the same symbols are assigned to the same elements, and redundant explanations are omitted. In this aspect, a group III-V semiconductor optical integrated device is explained.

First Aspect

Figure 1B:
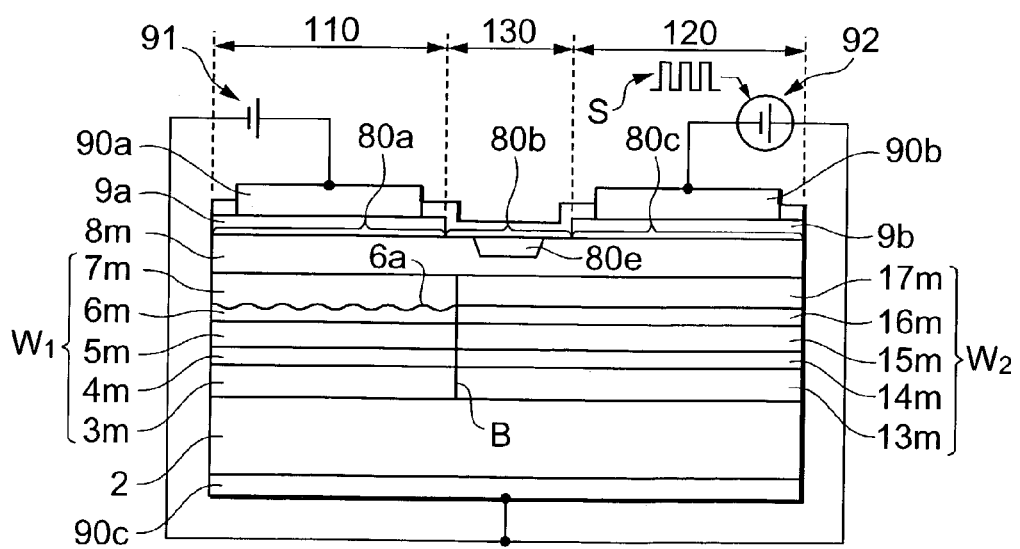
FIG. 1B is a cross-sectional view along line I—I in FIG. 1A.

FIG. 1A is a perspective view of the semiconductor optical integrated device of a first aspect. FIG. 1B is a cross-sectional view along line I—I in FIG. 1A. Referring to FIG. 1A, a semiconductor optical integrated device 1 comprises a substrate 2 of n-type InP. Trenches 19a, 19b are provided in semiconductor optical integrated device 1. Principal mesa 50 extending in a prescribed axial direction is specified by trenches 19a, 19b in semiconductor optical integrated device 1. Principal mesa 50 is separated into a light-emitting element portion 110, a modulation element portion 120 and a separation portion 130. Separation portion 130 is provided between light-emitting element portion 110 and modulation element portion 120. Therefore, light-emitting element portion 110, separation portion 130 and modulation element portion 120 are arranged in a prescribed axial direction in this order.

Referring to FIG. 1B, semiconductor mesa portion (first semiconductor mesa portion) of light-emitting element portion 110 has an n-type clad layer 3m, optical guide layer 4m, active layer 5m, optical guide layer 6m, and p-type first clad layer 7m. These semiconductor layers are provided on substrate 2; active layer 5m is provided between optical guide layers 4m and 6m; and active layer 5m as well as optical guide layers 4m and 6m are provided between clad layer 3m and first clad layer 7m. A diffraction grating 6a is provided at the interface between optical guide layer 6m and p-type first clad layer 7m. By means of these semiconductor layers, a semiconductor laser element portion is configured. Semiconductor mesa portion (second semiconductor mesa portion) of modulation element portion 120 has an n-type clad layer 13m, optical guide layer 14m, active layer 15m, optical guide layer 16m and p-type first clad layer 17m. These semiconductor layers are provided on substrate 2; active layer 15m is provided between optical guide layers 14m and 16m; and active layer 15m as well as optical guide layers 14m and 16m are provided between clad layer 13m and first clad layer 17m. By means of these semiconductor layers, an EA-type modulation element portion is configured.

The semiconductor portion (first semiconductor mesa portion) comprising semiconductor layers 3m through 7m are joined at interface B with the semiconductor portion (second semiconductor mesa portion) comprising semiconductor layers 13m through 17m. In this aspect, separation portion 130 comprises the same semiconductor layer as modulation element portion 120, but the present invention is not limited to this configuration. Also, in FIG. 1B diffraction grating 6a is formed between optical guide layer 6m, and first clad layer 7m, but may be formed instead between clad layer 3m and optical guide layer 4m.

The following is an example which illustrates the elements and dopants comprised by each of the above layers. For simplicity, a $Ga_xIn_{1-x}As_yP_{1-y}$ semiconductor ($0 \geq x \geq 1$, $0 \geq y \geq 1$) is written as GaInAsP.

| | |
|---|---|
| n-type clad layers 3 m, 13 m: | Si-doped InP |
| optical guide layers 4 m, 14 m: | undoped GaInAsP |
| active layers 5 m, 15 m: | undoped GaInAsP |
| optical guide layers 6 m, 16 m: | undoped GaInAsP |
| p-type first clad layers 7 m, 17 m: | Zn-doped InP |

Active layers 5m, 15m comprise a multi-quantum well (MQW) structure of GaInAsP. The MQW structure in active layer 5m is designed such that light emitted from semiconductor optical integrated device 1 has a prescribed wavelength $\lambda$. The MQW structure in active layer 15m is designed such that the photoluminescence wavelength $\lambda_{p11}$ of the MQW structure is shorter by approximately 50 nm than the oscillation wavelength $\lambda$. The composition ratios x, y of optical guide layers 4m, 6m, 14m, 16m are determined such that the photoluminescence wavelength $\lambda_{p12}$ corresponding to the energy band gap (hereafter Eg) of the optical guide layer is shorter than the wavelength $\lambda_{p11}$. As stated above, n-type clad layers 3m, 13m and p-type first clad layers 7m, 17m are of InP, and so have a low refractive index compared with the active layers and optical guide layers.

Referring to FIG. 1B, semiconductor optical integrated device 1 further has a p-type second clad layer 8m (first conductivity type group III-V semiconductor layer) on the first and second semiconductor mesa portion. Second clad layer 8m is provided in common for light-emitting element portion 110, modulation element portion 120 and separation portion 130. Namely, light-emitting element portion 110, modulation element portion 120 and separation portion 130 are composed of respective semiconductor mesa portion and second clad layer 8m. Second clad layer 8m comprises a p-type InP, similarly to p-type first clad layers 7m, 17m. Hence second clad layer 8m serves, together with p-type first clad layers 7m, 17m, to confine laser light to the optical guide layer and active layer. Active layer 5m, optical guide layers 4m and 6m, as well as clad layers 3m and 7m are principal components of optical waveguide $W_1$. Also, active layer 15m, optical guide layers 14m and 16m, as well as clad layers 13m and 17m are principal components of optical waveguide $W_2$.

Second clad layer 8m has a first portion 80a (first region), second portion 80b (second region), and third portion 80c (third region). An electrode 90a for light-emitting element portion 110 is formed in first portion 80a, via a contact layer 9a. An electrode 90b for modulation element portion 120 is formed in third portion 80c, via a contact layer 9b. And, an electrode 90c used in common by light-emitting element portion 110 and modulation element portion 120 is formed on the back surface of substrate 2.

In second portion 80b is provided a depression portion, extending in a direction to intersect with the direction of extension of optical waveguides $W_1$, $W_2$. This depression portion is provided to a depth so as not to reach first clad layer 17m, and to a width so as not to touch contact layers 9a, 9b. The depression portion may reach to the interior of first clad layer 17m, so long as optical guide layer 16m is not reached. When the bottom of depression portion is positioned within first clad layer 17m, the light propagated through optical guide layer 16m is not affected by the depression portion, while the effect of semiconductor embedded portion 80e to be explained below is enhanced.

In this depression portion is provided an n-type semiconductor, such as for example a semiconductor embedded portion 80e of n-type InP. Second clad layer 8m and semiconductor embedded portion 80e form a homojunction. Also, second clad layer 8m and semiconductor embedded portion 80e form a pn junction. Hence the depletion layer extends into second clad layer 8m and semiconductor embedded portion 80e. It is preferable that the n-type impurity concentration of semiconductor embedded portion 80e be, for example, $5 \times 10^{17}$ cm$^{-3}$ or lower. If the impurity concentration is higher than $5 \times 10^{17}$ cm$^{-3}$, then the depletion layer appearing at the interface between semiconductor embedded portion 80e and second clad layer 8m is of insufficient. When a reverse bias voltage is applied to this junction portion, breakdown occurs, and current flows in the junction portion. That is, a leakage current occurs. Also, semiconductor embedded portion 80e may comprise an unintentionally doped n-type semiconductor. In this aspect also, a homojunction is formed between semiconductor embedded portion 80e and second clad layer 8m. In this case, the n-type impurity concentration in the InP of semiconductor embedded portion 80e is less than $1 \times 10^{14}$ cm$^{-3}$, and semiconductor embedded portion 80e is a high-resistivity semiconductor portion, and is depleted.

Below, the action of semiconductor optical integrated device 1 is explained. Referring to FIG. 1B, in light-emitting element portion 110, electrode 90a is connected to the anode of a power supply 91, and electrode 90c is connected to the cathode of power supply 91. Hence a forward-bias voltage is applied to light-emitting element portion 110. In modulation element portion 120, electrode 90b is connected to the cathode of a power supply 92, and electrode 90c is connected to the anode of power supply 92. Hence a reverse-bias voltage is applied to modulation element portion 120. Power supply 92 receives a modulation signal S, and can output a voltage according to modulation signal S. Modulation signal S may be, for example, a pulse signal. Electrode 90c is used in common by light-emitting element portion 110 and by modulation element portion 120.

When a voltage is applied to light-emitting element portion 110 as explained above, light is emitted from active layer 5m of light-emitting element portion 110. Laser oscillation then occurs, and laser light is guided within the optical waveguide.

When a sufficiently low voltage, such as for example 0 V, is applied to modulation element portion 120, because the effective absorption edge wavelength of active layer 15m is short compared to the oscillation wavelength λ, the laser light is transmitted through active layer 15m without absorption. However, when a sufficiently large reverse-bias voltage is applied to modulation element portion 120, the quantum confined Stark effect (QCSE) occurs in active layer 15m, and due to this effect, light is absorbed. Hence when a reverse-bias voltage corresponding to modulation signal S is applied to modulation element portion 120 from power supply 92, laser light is modulated according to modulation signal S and is emitted from semiconductor optical integrated device 1.

Semiconductor optical integrated device 1 of the first aspect comprises light-emitting element portion 110, modulation element portion 120, and separation portion 130, on the same substrate. Light-emitting element portion 110 comprises a semiconductor laser element portion; modulation element portion 120 comprises a modulation element portion. Between light-emitting element portion 110 and modulation element portion 120 is formed a separation portion 130. Semiconductor embedded portion 80e is provided in second clad layer 8m of separation portion 130. Whereas second clad layer 8m comprises p-type InP, semiconductor embedded portion 80e comprises n-type InP. That is, a p-n-p structure is formed between electrodes 90a and 90b, and the second clad layer in light-emitting element portion 110 is connected with the second clad layer in modulation element portion 120 via the second clad layer directly below semiconductor embedded portion 80e. The thickness of second clad layer 8m directly below semiconductor embedded portion 80e is smaller than the thickness of second clad layer 8m of light-emitting element portion 110 and modulation element portion 120. Hence the resistance of the portion of second clad layer 8m directly below semiconductor embedded portion 80e is high. Therefore the leakage current occurring between electrodes 90a, 90b via second clad layer 8m is reduced.

Referring to FIG. 1A, in principal mesa 50, a narrow portion 50c is provided in which the interval between side walls 50a, 50b is, in separation portion 130, small compared with the interval in light-emitting element portion 110 and in modulation element portion 120. In narrow portion 50c, the width of second clad layer 8m is also smaller than the width of second clad layers 8m in light-emitting element portion 110 and in modulation element portion 120. Hence the cross-sectional area of the path through which a leakage current flows between electrodes 90a, 90b via second clad layer 8m is reduced. Therefore the leakage current between electrodes 90a, 90b via second clad layer 8m is further reduced.

Further, semiconductor embedded portion 80e, being formed of the same semiconductor (InP) as second clad layer 8m, has the same refractive index as second clad layer 8m. Hence almost no loss occurs in the intensity of the laser light propagating in the optical waveguide. However, the refractive index of the semiconductor comprised by semiconductor embedded portion 80e may differ from the refractive index of second clad layer 8m, within the range in which the loss of light transmitted through separation portion 130 enables practical use.

Second Aspect

Next, a semiconductor optical integrated device 100 of a second aspect is explained. Semiconductor optical integrated device 100 has a structure identical to that of semiconductor optical integrated device 1 of the first aspect, except for the fact that an electrode is provided on semiconductor embedded portion 80e. Below is an explanation focusing mainly on the differences.

Figure 2:
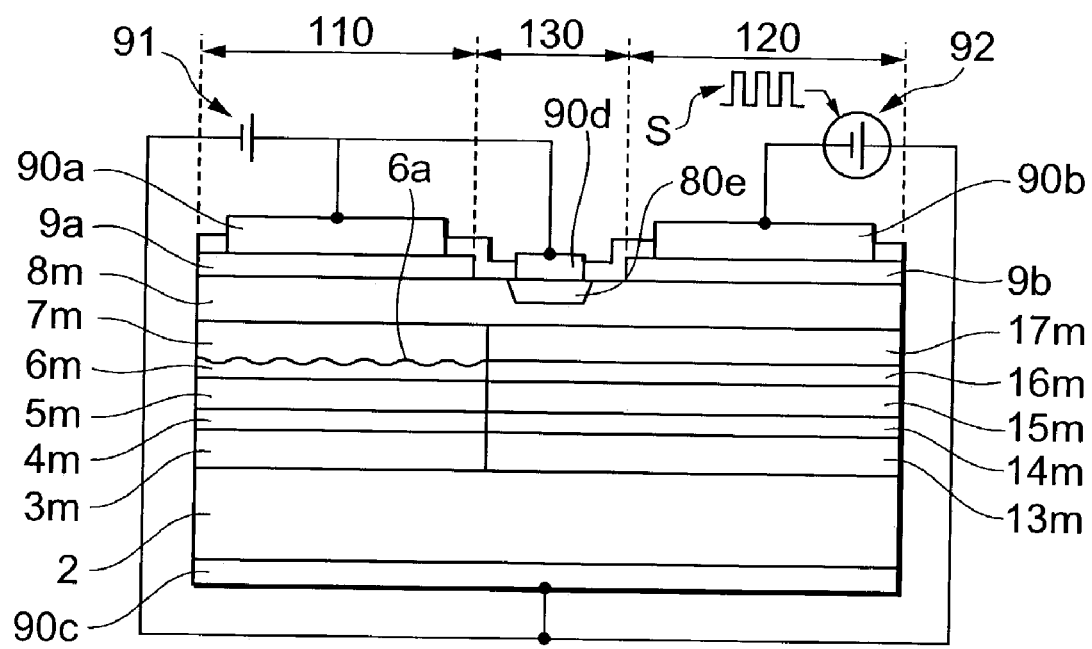
FIG. 2 is a cross-sectional view of the semiconductor optical integrated device of a second aspect.

FIG. 2 is a cross-sectional view of semiconductor optical integrated device 100 of the second aspect. The structure of semiconductor optical integrated device 100 is shown in the cross-sectional view corresponding to the I—I line of semiconductor optical integrated device 1 of the first aspect; this cross-section corresponds to the cross-section of FIG. 1B. Referring to FIG. 2, an electrode 90d is provided on semiconductor embedded portion 80e. Also, during operation of semiconductor optical integrated device 100, as shown in FIG. 2, electrodes 90d and 90a are connected. By means of this connection, electrodes 90a and 90d are maintained at the same potential. Also, semiconductor optical integrated device 100 may have a conductor portion which connects the electrodes 90a and 90b.

Referring to FIG. 2, when semiconductor optical integrated device 100 is operated, electrode 90a is maintained at a positive potential, and electrode 90b at a negative potential, relative to electrode 90c. Hence electrode 90a is always at a high potential compared to electrode 90b. Because electrodes 90a and 90d are grounded, electrode 90d is always maintained at a positive potential relative to electrode 90b. Hence a reverse-bias voltage is applied across semiconductor embedded portion 80e (n-type InP) and the third portion 80c (p-type InP) of second clad layer 8m. Through application of a reverse bias, the depletion layer extends into the side of second clad layer 8m. Hence the path of the leakage current occurring between electrodes 90a, 90b via second clad layer 8m is further constricted. Consequently the leakage current is further reduced.

Third Aspect

A method of manufacture of a semiconductor optical integrated device of a third aspect of this invention is explained, referring to FIGS. 3A to 3C, FIGS. 4A to 4C, FIGS. 5A to 5C, FIGS. 6A to 6C, FIGS. 7A to 7C, FIGS. 8A to 8C, and FIG. 9. Below, the case of manufacture of semiconductor optical integrated device 1 is explained.

Process of Formation of Multilayer Film for Semiconductor Laser

Figure 3A:
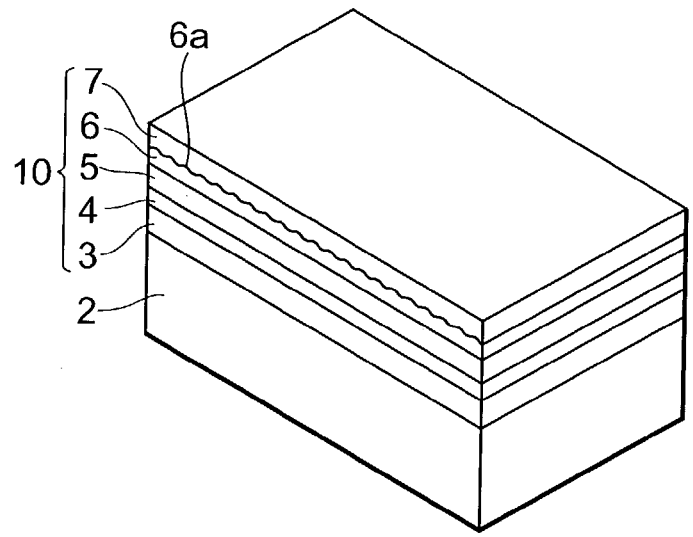
FIGS. 3A through 3C, 4A through 4C, 5A through 5C, 6A through 6C and 7A through 7C are drawings which explain a method of manufacture of the semiconductor optical integrated device of a third aspect.

First, the process of formation of a multilayer film for a semiconductor laser is explained, referring to FIG. 3A. An n-type clad film 3, optical guide film 4, active layer film 5, and optical guide film 6 are grown, in order, on substrate 2 of n-type InP. Metal-organic chemical vapor deposition (MOCVD) can be used in the growth of films 3 through 6. The following are examples of the constituent elements, dopants, and thicknesses of films 3 through 6.

| | |
|---|---|
| n-type clad film 3: | Si-doped InP, 200 nm |
| optical guide film 4: | undoped GaInAsP, 50 nm |
| active layer film 5: | undoped GaInAsP, 150 nm |
| optical guide film 6: | undoped GaInAsP, 50 nm |

Active layer film 5 comprises an MQW of GaInAsP semiconductor.

Next, a diffraction grating 6a is formed on the surface of optical guide film 6. Diffraction grating 6a is formed by, for example, forming a plurality of periodic grooves in the surface using lithography and etching. Next, a p-type first clad film 7 is grown epitaxially by MOCVD on diffraction grating 6a. An example of the constituent elements, dopant, and thickness of first clad film 7 are as follows. first clad film 7:Zn-doped InP, 200 nm By using the MOCVD method, even when grown on top of diffraction grating 6a, first clad film 7 of thickness approximately 200 nm has a flattened surface. This completes the formation of multilayer film 10 for a semiconductor laser.

Process of Formation of First Mask

Figure 3B:
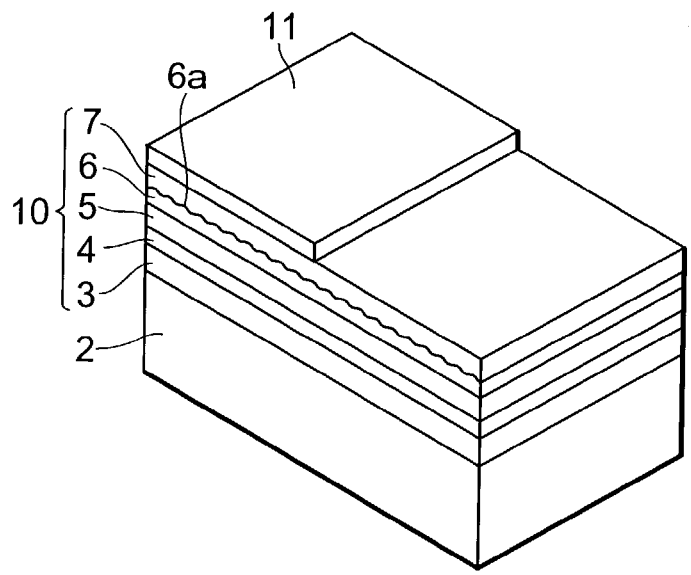

Referring to FIG. 3B, a first mask layer 11 is formed on first clad film 7. First mask layer 11 covers the portion of multilayer film 10 which is to be the semiconductor laser element portion. First mask layer 11 comprises silicon nitride (SiN) film, and is formed by methods such as CVD, photolithography and etching. First mask layer 11 may be composed of insulating silicon compound films such as silicon oxide ($SiO_2$) film and silicon oxynitride (SiON) film.

First Etching Process

Figure 3C:
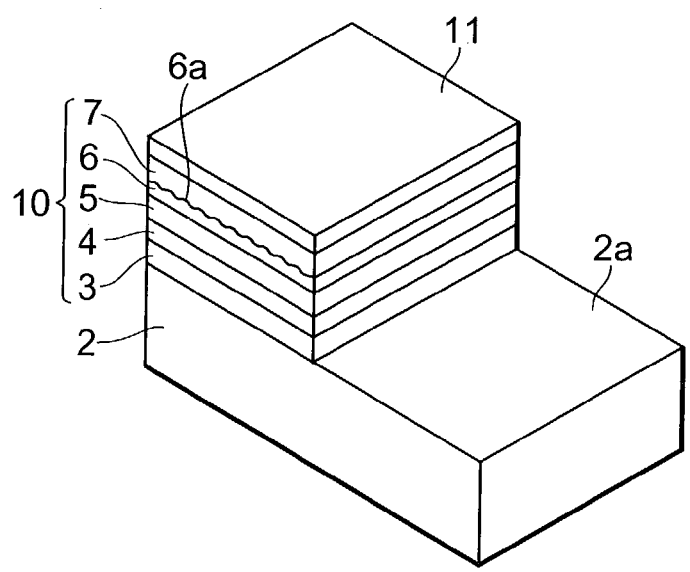

Next, an etching process is explained, referring to FIG. 3C. Using first mask layer 11, semiconductor multilayer film 10 is etched. This etching is performed using, for example, reactive ion etching (RIE). By means of this etching, the portion of multilayer film 10 where first mask layer 11 has not been formed is removed, exposing a principal face 2a of substrate 2.

Process of Formation of Multilayer Film for Modulation Element

Figure 4A:
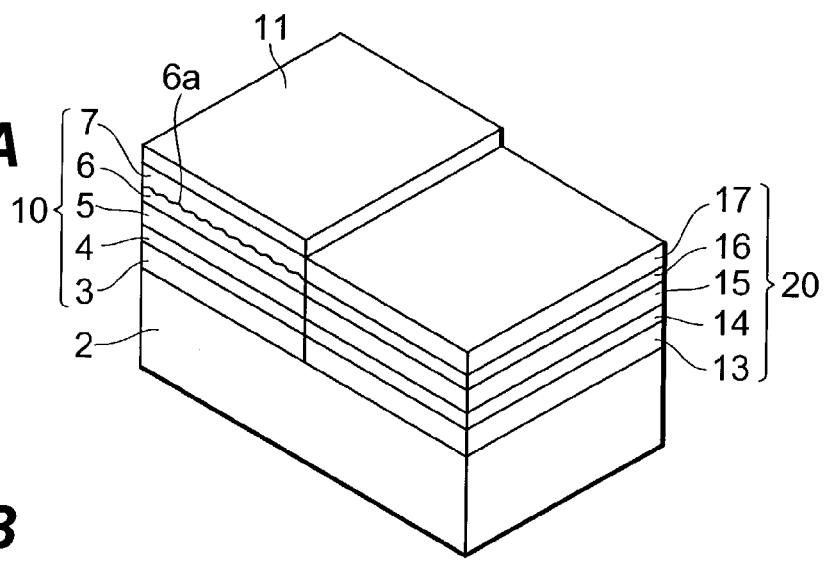
Figure 4B:
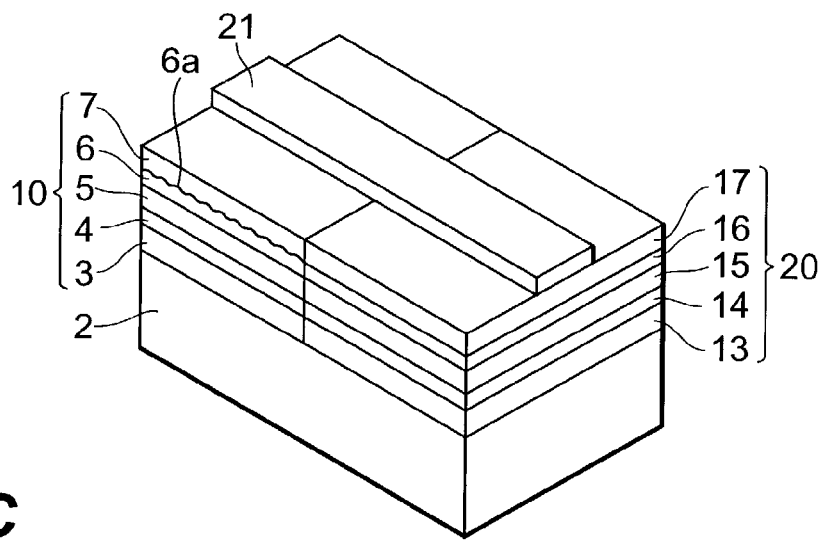

Next, a process of formation of a multilayer film for a modulation element (and separation portion) is explained, referring to FIG. 4A. In this process, while leaving first mask layer 11 as it is, an n-type clad film 13, optical guide film 14, active layer film 15, optical guide film 16, and first clad film 17 are grown, in order, on principal face 2a of substrate 2.

The following are examples of the constituent elements, dopants, and thicknesses of films 13 through 17.

| | |
|---|---|
| n-type clad film 13: | Si-doped InP, 200 nm |
| optical guide film 14: | undoped GaInAsP, 50 nm |
| active layer film 15: | undoped GaInAsP, 150 nm |
| optical guide film 16: | undoped GaInAsP, 50 nm |
| first clad film 17: | Zn-doped InP, 200 nm |

Active layer film 15 comprises a quantum well structure such as MQW, comprising GaInAsP semiconductor. By means of the above processes, multilayer film 20 for the modulation element is formed.

The thicknesses of each of the films in multilayer films 10 and 20 are determined such that optical waveguide $W_2$ formed from films 13 through 17 is optically matched to optical waveguide $W_1$ formed from films 3 through 7, thereby making the fist and second semiconductor mesa portions optically coupled with each other.

Mesa Formation Process

The mesa formation process is explained below, referring to FIG. 4C. After formation of multilayer film 20, first mask layer 11 is removed, exposing first clad films 7, 17. Second mask layer 21 is formed in a stripe shape extending in a prescribed axial direction on first clad films 7, 17. Second mask layer 21 is formed from SiN film. However, second mask layer 21 can be formed from an insulating silicon compound film such as $SiO_2$ film or SiON film. By etching multilayer films 10, 20 using RIE, employing second mask layer 21, to an extent such that the principal face of substrate 2 is exposed, semiconductor mesa 30 extending in a prescribed axial direction is formed.

Figure 4C:
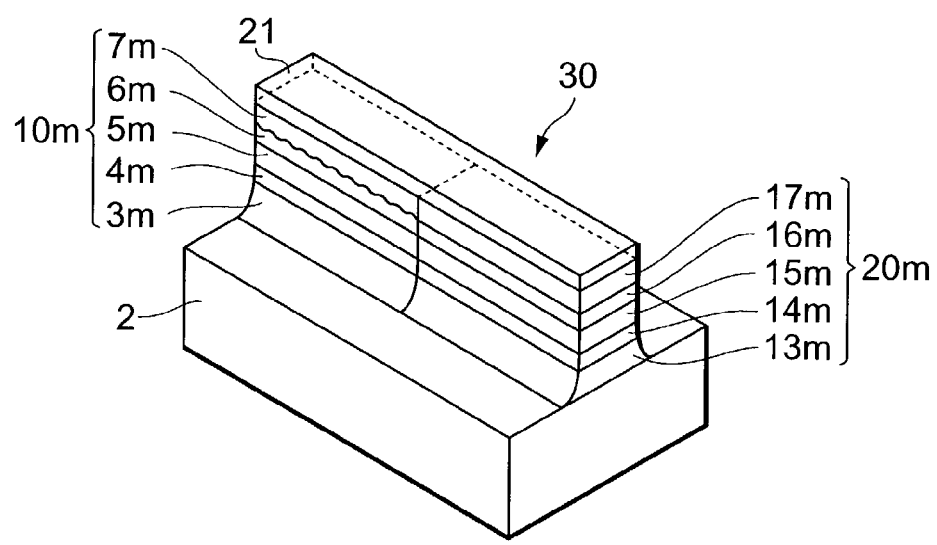

Referring to FIG. 4C, mesa 30 has a first mesa portion 10m, formed from multilayer film 10 for a semiconductor laser, and a second mesa portion 20m, formed from multilayer film 20 for a modulator. First mesa portion 10m has a clad layer 3m, optical guide layer 4m, active layer 5m, optical guide layer 6m, and first clad layer 7m. Second mesa portion 20m has a clad layer 13m, optical guide layer 14m, active layer 15m, optical guide layer 16m, and first clad layer 17m.

Embedded Layer Formation Process

Figure 5A:
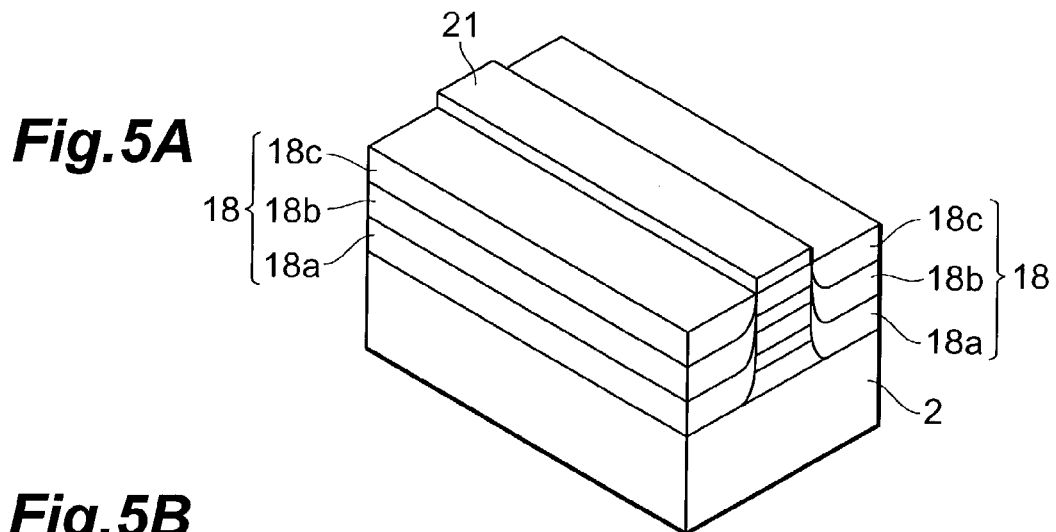

Next, a process of formation of an embedded layer forming a current-constricting structure is explained, referring to FIG. 5A. With second mask layer 21 left in place, a p-type InP layer 18a, n-type InP layer 18b, and p-type InP layer 18c are grown, in order, on the exposed surface of substrate 2. By means of processes up to this point, an embedded layer 18 is formed, and mesa 30 is embedded. Following this, second mask layer 21 is removed.

Process of Formation of Second Clad Layer and Contact Layer

Figure 5B:
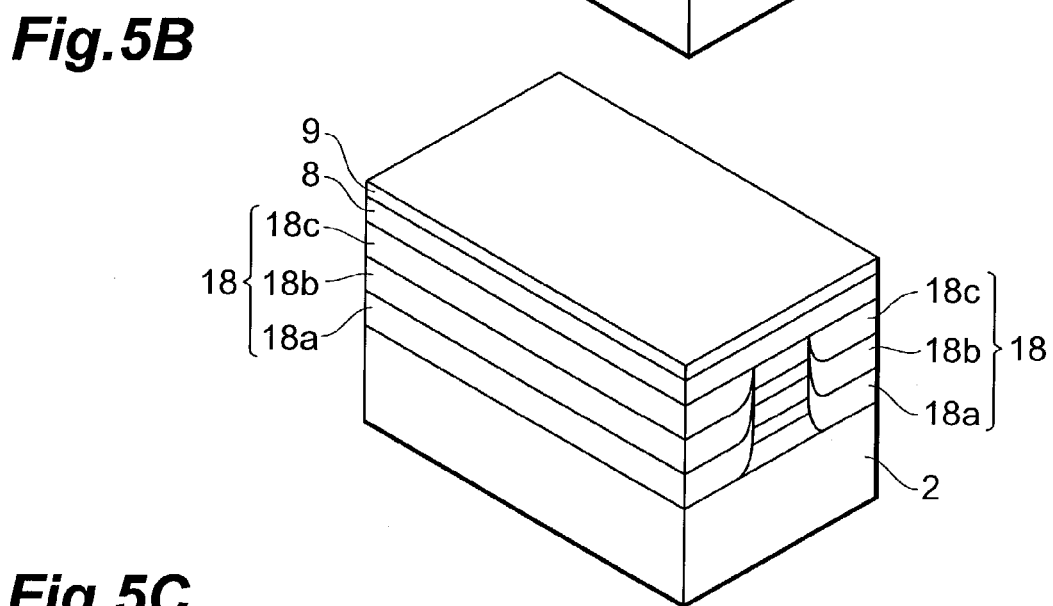

Next, a process of formation of a second clad layer and contact layer is explained, referring to FIG. 5B. In this process, a second clad film 8 and contact film 9 are grown epitaxially, in order, in embedded layer 18 and first clad layers 7m, 17m. Second clad film 8 comprises InP of thickness approximately 2 μm. Zn is added to second clad film 8, and the p-type impurity concentration can be made approximately $1\times10^{18}$ cm$^{-3}$. Second clad film 8 comprises InP, and so has a refractive index smaller than that of optical guide layers 6m, 16m and active layers 5m, 15m, comprising GaInAsP. Contact film 9 comprises, for example, a Zn-doped GaInAs semiconductor, the p-type impurity concentration of which can be made approximately $1\times10^{19}$ cm$^{-3}$ or higher in order to easily achieve an electrode ohmic contact, described below.

Process of Separation of Contact Layer

Figure 5C:
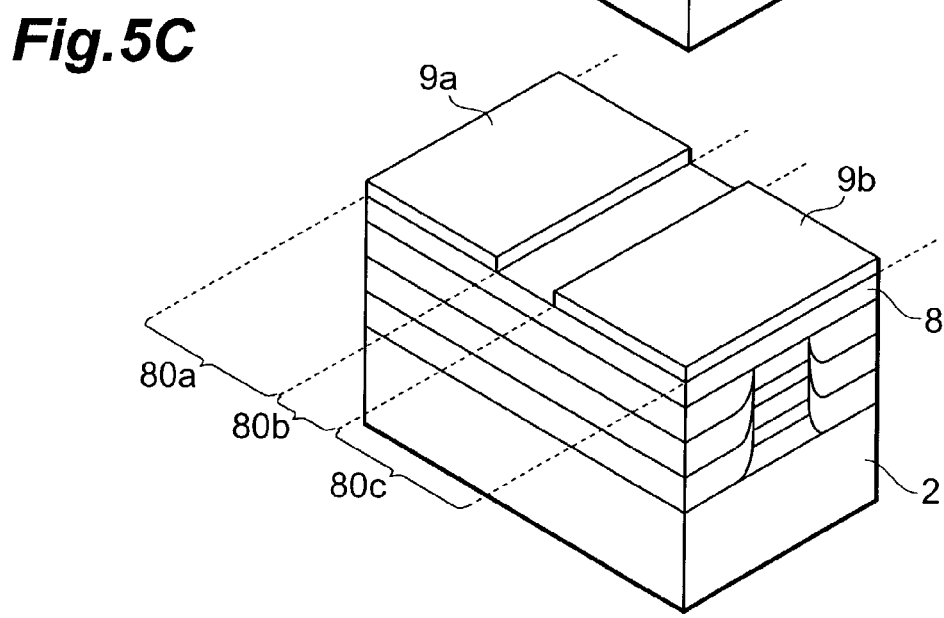

Referring to FIG. 5C, second clad film 8 has a first portion 80a, second portion 80b, and third portion 80c. In first portion 80a, second clad film 8 is covered by contact layer 9a; in second portion 80b, second clad film 8 is exposed; and in third portion 80c, second clad film 8 is covered by contact layer 9b. Contact layers 9a, 9b are formed as described below. First, the portions of contact film 9 to become contact layers 9a, 9b are covered by a photomask. Next, the portion not covered by the photomask is removed using phosphoric acid etching solution, and second portion 80b of second clad film 8 is exposed. The phosphoric acid etching solution has an extremely rapid etching rate for GaInAs as compared with InP. Hence when second clad film 8, which is the underlayer, is exposed, the etching effectively halts. By the above process, contact layers 9a, 9b are obtained. The interval between contact layers 9a, 9b can be made at least 30 μm approximately.

Process of Formation of Semiconductor Embedded Portion

Figure 8A:
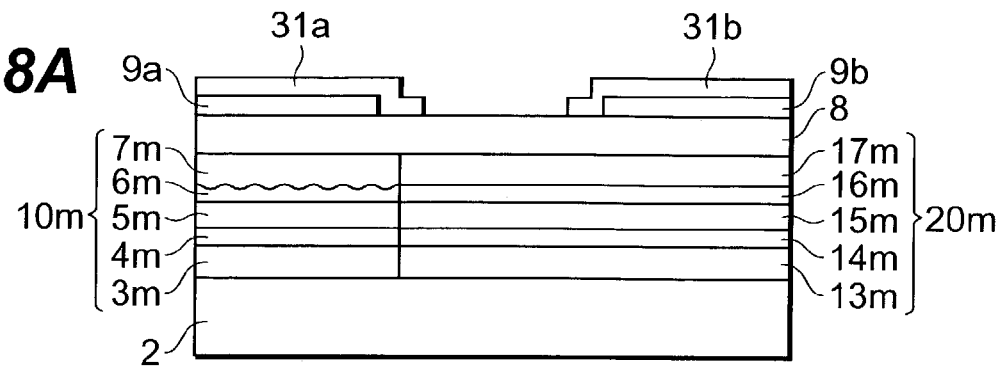
FIGS. 8A through 8C are cross-sectional views along lines II—II in FIGS. 6A through 6C respectively.
Figure 8B:
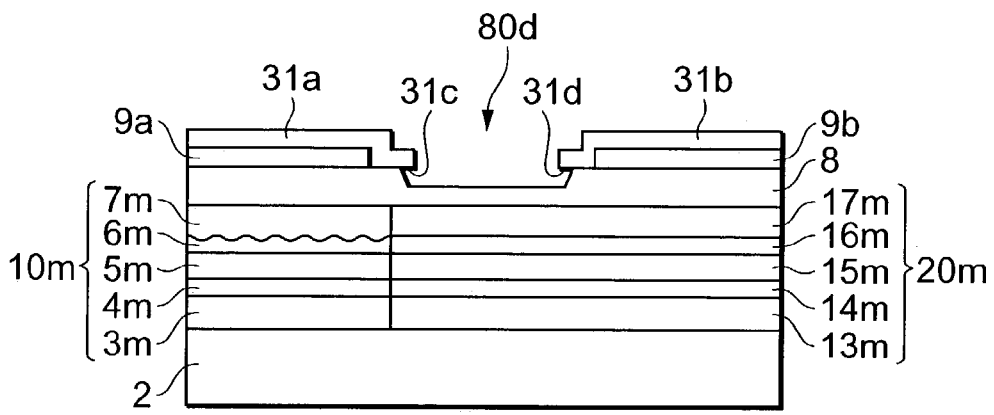
Figure 8C:
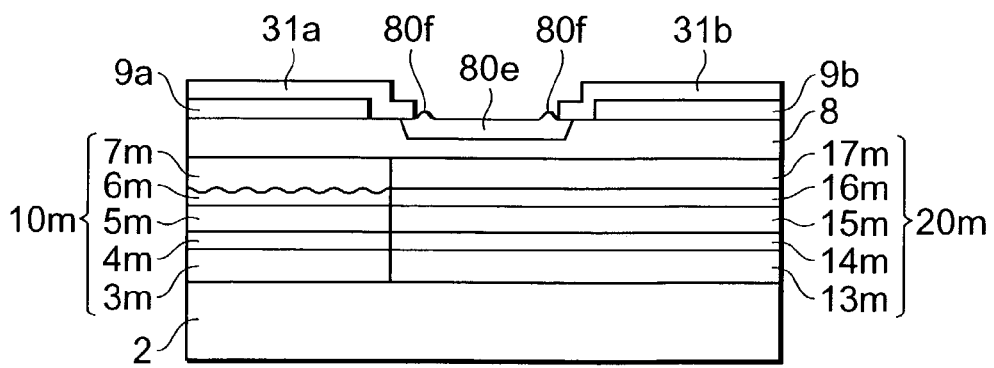

Next, the procedure for formation of the semiconductor embedded portion 80e is explained, referring to FIGS. 6A to 6C and FIGS. 8A to 8C. FIGS. 8A to 8C are cross-sectional views along lines II—II in FIGS. 6A to 6C, respectively.

Figure 6A:
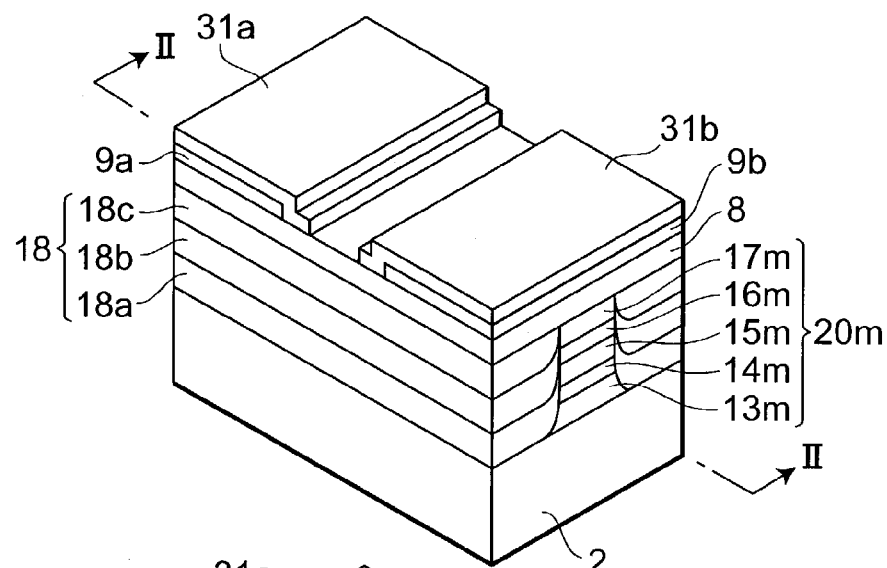

Referring to FIG. 6A, third mask layers 31a, 31b are formed in order to form semiconductor embedded portion 80e in second portion 80b of second clad film 8. Third mask layers 31a, 31b comprise insulating film such as of SiN. Referring to FIG. 8A, third mask layer 31a covers contact layer 9a, and also extends at least 5 μm approximately from the edge of contact layer 9a to cover a portion of second portion 80b. Third mask layer 31b covers contact layer 9b, and also extends at least 5 μm approximately from the edge of contact layer 9b to cover a portion of second portion 80b. The interval between third mask layers 31a, 31b is approximately 20 μm.

Figure 6B:
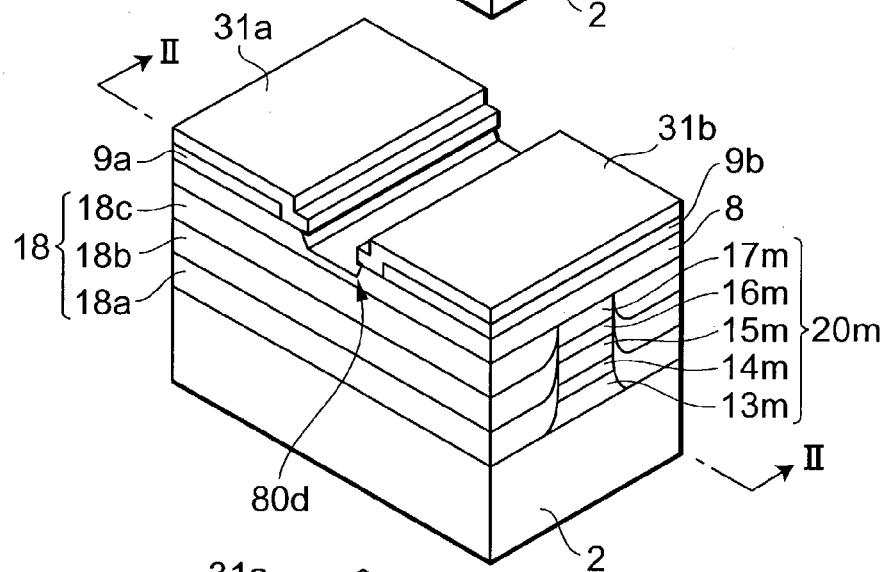

When etching is performed using third mask layers 31a, 31b, as shown in FIG. 6B and in FIG. 8B, a depression portion 80d is formed in second clad film 8 of second portion 80b. It is preferable that the depth of depression portion 80d be 0.5 times or more than the thickness of second clad film 8. The bottom of depression portion 80d may be positioned at first clad layer 17m. According to the results of studies by the inventors, if the depth of depression portion 80d is less than 0.5 times the thickness of second clad film 8, the effect in preventing leakage currents is in sufficient. On the other hand, if the bottom of depression portion 80d reaches to optical guide layer 16m, light propagating in the optical waveguide of the semiconductor mesa portion is adversely affected. Specifically, for a 2.0 μm thickness of second clad film 8, the depth of depression portion 80d can be made approximately 1.8 μm. A bromide methyl alcohol solution can be used as the etching solution for this etching. By means of this etching, isotropic etching is performed, so that side etching occurs in second clad film 8. Consequently third mask layers 31a, 31b form eave portions 31c, 31d relative to second clad film 8.

Figure 6C:
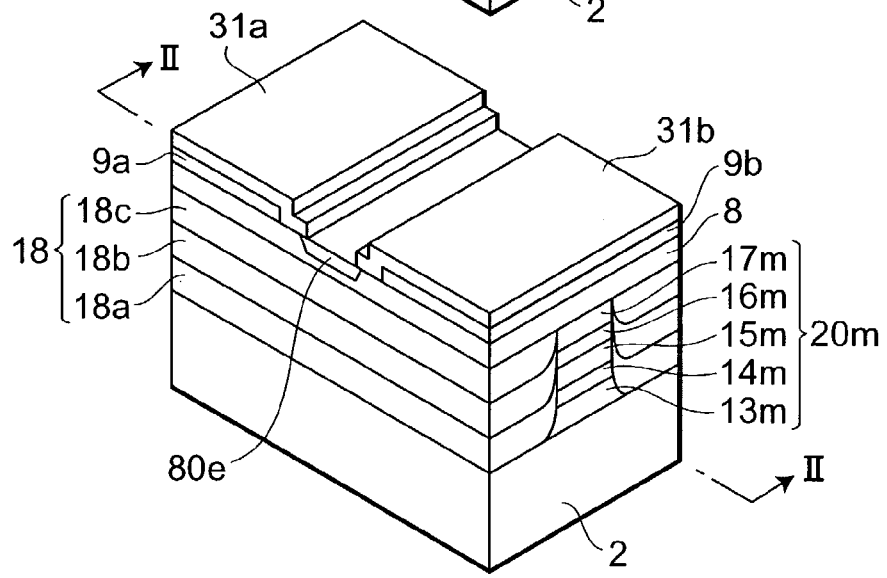

Referring to FIGS. 6C and 8C, the formation of the semiconductor embedded portion is explained. Following the above process, while third mask layers 31a, 31b are being left in place, MOCVD is used to bury depression portion 80d with n-type InP, forming semiconductor embedded portion 80e. Using the MOCVD method, depression portion 80d is buried without the occurrence of a gap below the eave portions 31c, 31d. On the surface of semiconductor embedded portion 80e, a protrusion 80f is formed adjacent to the edges of third mask layers 31a, 31b, as shown in FIG. 8C. However, the height of protrusion 8f is sufficiently low so that there is no effect on the characteristics of the fabricated semiconductor optical integrated device or in subsequent manufacturing processes.

As the dopant for the n-type InP of semiconductor embedded portion 80e, for example, Si may be added. In this case, it is preferable that then-type impurity concentration of semiconductor embedded portion 80e be $5\times10^{17}$ cm$^{-3}$ or less. Semiconductor embedded portion 80e may also be composed of an unintentionally doped n-type InP. In this case, it is preferable that n-type impurity concentration be less than $1\times10^{14}$ cm$^{-3}$. Further, semiconductor embedded portion 80emay be composed of double layers structure, in which an unintentionally doped n-type semiconductor layer with n-type impurity concentration of less than $1\times10^{14}$ cm$^{-3}$ is grown on p-type second clad layer 8m and a n-type impurity doped semiconductor layer with impurity concentration of not more than $5\times10^{17}$ cm$^{-3}$ is grown on the unintentionally doped n-type semiconductor layer.

Process of Principal Mesa Formation

Figure 7A:
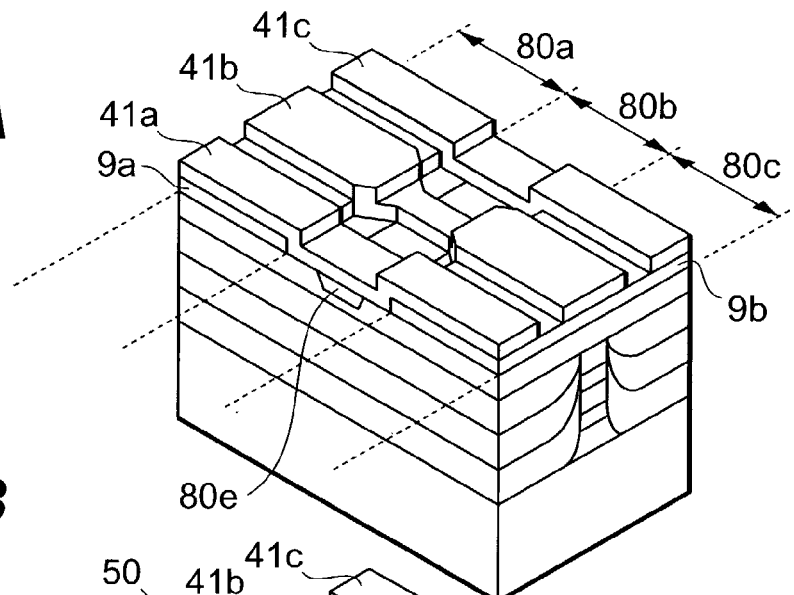

Below, the process of principal mesa formation is explained, referring to FIGS. 7A to 7C and FIG. 9. Referring to FIG. 7A, after forming semiconductor embedded portion 80e, third mask layers 31a, 31b are removed. Then, fourth mask layers 41a to 41c are formed on contact layers 9a, 9band second portion 80b comprising semiconductor embedded portion 80e. Fourth mask layers 41a to 41c comprise insulating film such as SiN.

Figure 9:
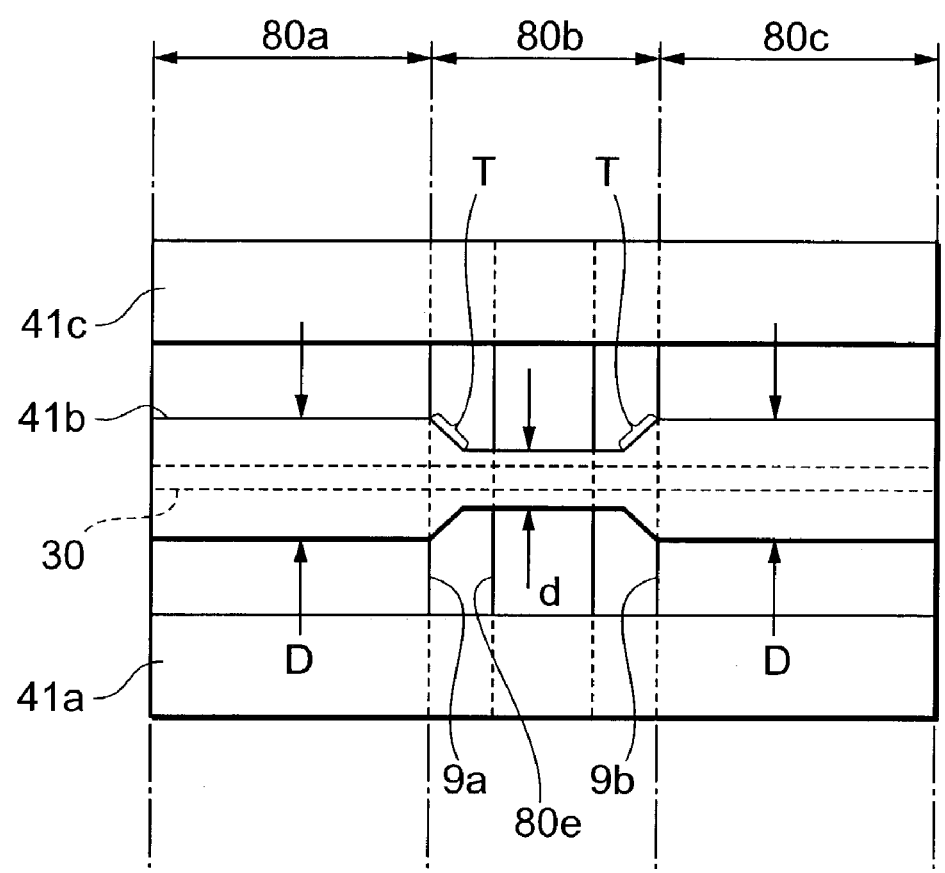
FIG. 9 is a plane view of the fourth mask layers.

FIG. 9 is a plane view of fourth mask layers 41a to 41c. Referring to FIG. 9, fourth mask layers 41a, 41c have a stripe shape, extended along the direction of extension of mesa 30. Fourth mask layer 41b is between fourth mask layers 41a and 41c, overlapping mesa 30. Fourth mask layer 41b has width D above first portion 80a and third portion 80c of second clad film 8. Also, fourth mask layer 41b has a portion with width d above second portion 80b of second clad film 8, and a taper portion T where the width changes from D to d. As shown in the figure, width D is greater than width d.

Figure 7B:
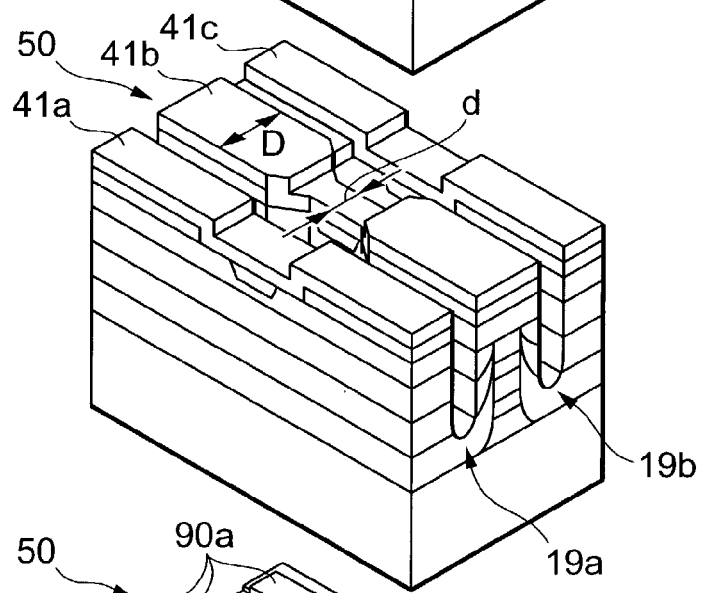

Etching is explained, referring to FIG. 7B. When etching is performed using fourth mask layers 41a to 41c, trenches 19a, 19b are formed. In this etching, the RIE method may be used, or a solution the principal component of which is hydrobromic acid (HBr), may be used. By means of trenches 19a, 19b, principal mesa 50, comprising mesa 30, is delineated. The shape of fourth mask layer 41b is reflected in principal mesa 50. That is, the interval between side walls 50a, 50b is D in the portions-which are to become light-emitting element portion 110 and modulation element portion 120. In the portion which is to become separation portion 130, there are a portion in which the interval between side walls 50a, 50b is d, and a portion in which the width changes from D to d (D>d).

Electrode Formation Process

Figure 7C:
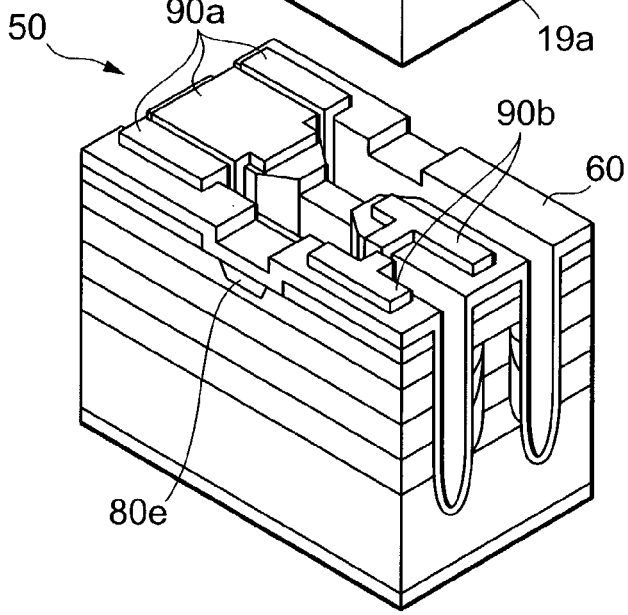

The electrode formation process is explained, referring to FIG. 7C. After forming trenches 19a, 19b, a passivation film 60 to protect the side faces of principal mesa 50 is deposited. Similarly to fourth mask layers 41a, 41b, passivation film 60 comprises an insulating film such as SiN. Next, aperture portions in which electrodes are to be formed are provided in passivation film 60 and fourth mask layers 41a, 41b. To this end, a resist mask is formed on passivation film 60. Then, by etching using this resist mask, the portions of passivation film 60 and underlayer fourth mask layers 41a, 41b exposed in the resist mask aperture portions are removed. By this means aperture portions are formed in passivation film 60 and fourth mask layers 41a, 41b, and contact layers 9a, 9b are exposed in the aperture portions. Next, leaving the resist mask in place, metal film comprising two layers such as Au/Zn is deposited, for example by evaporation deposition, onto contact layers 9a, 9b exposed in the aperture portions. When the resist mask is then removed, electrodes 90a, 90b are formed. By means of the above process, semiconductor optical integrated device 1 is completed.

In the above manufacturing method, after formation of first clad films 7, 17, p-type second clad film 8 and contact film 9 are formed on top in order. After formation of contact layers 9a, 9b from contact film 9, a semiconductor embedded portion 80e, comprising n-type InP, is formed on second clad film 8. Because this procedure is used, semiconductor embedded portion 80e can be formed. In semiconductor optical integrated device 1, semiconductor embedded portion 80e has the function of reducing the leakage current occurring between electrodes 90a and 90b via second clad layer 8m. Hence by means of the above manufacturing method, a semiconductor optical integrated device with reduced leakage current can be manufactured.

Also, because fourth mask layer 41b having the shape shown in FIG. 9 is used, a narrow portion 50c is formed in second portion 80b. Narrow portion 50c also has the effect of reducing the above leakage current.

Fourth Aspect

Next, a method of manufacture of the semiconductor optical integrated device of a fourth aspect is explained. The method of manufacture of the fourth aspect differs from the method of manufacture of the first aspect in the procedure for formation of the contact film and semiconductor embedded portion. The following explanation focuses on the differences.

FIGS. 10A through 10C and FIGS. 11A through 11C explain the procedure for formation of the semiconductor embedded portion in the semiconductor optical integrated device manufacturing processes of the fourth aspect. In the figures, similarly to FIG. 8, which was referenced in the explanation of the first aspect, a cross-section of the semiconductor optical integrated device is shown.

Figure 10A:
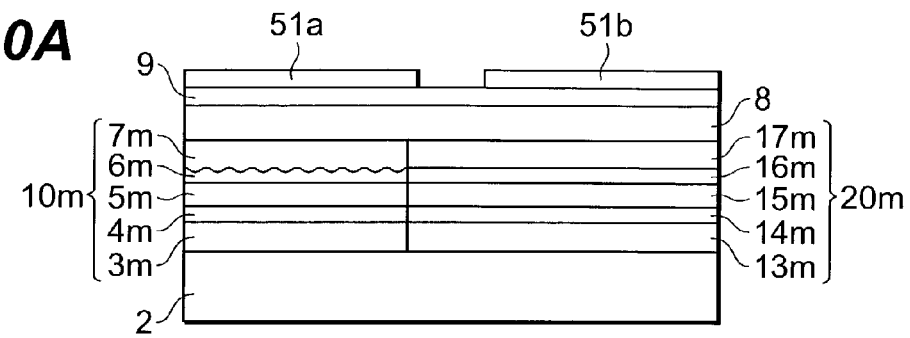
FIGS. 10A through 10C and 11A through 11C are drawings explaining procedure for formation of a semiconductor embedded portion in a manufacturing process for the semiconductor optical integrated device of a fourth aspect.
Figure 10B:
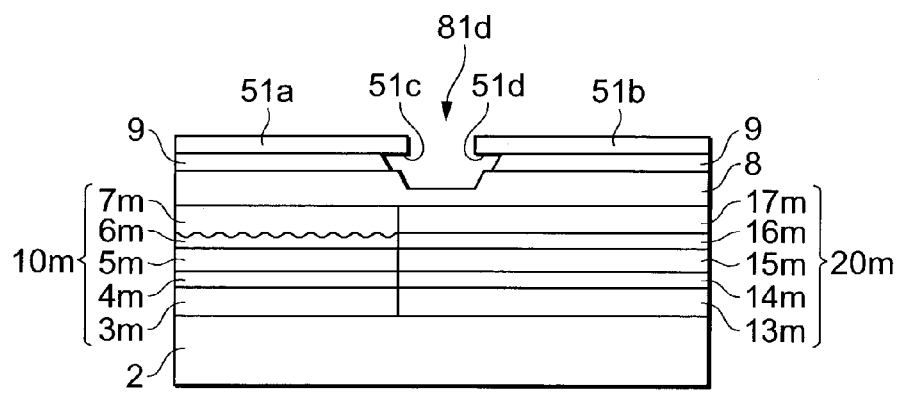

First, processes up to the epitaxial growth of a contact film 9 (p-type GaInAs) are executed according to the procedure of the first aspect. Then, as shown in FIG. 10A, third mask layers 51a, 51b are formed on contact film 9. The interval between third mask layers 51a, 51b can be approximately 20 μm. When etching of contact film 9 and second clad film 8 is performed using third mask layers 51a, 51b, depression portion 81d is formed, as shown in FIG. 10B. The depth of depression portion 81d can be made approximately 1.5 μm. In this etching, bromide methyl alcohol solution is used as the etching solution. Using this etching liquid, contact film 9 comprising p-type GaInAs is side-etched, and as shown in FIG. 10B, eave portions 51c, 51d are formed underneath third mask layers 51a, 51b. Eave portions 51c, 51d are long compared with eave portions 31c, 31d in the first aspect.

Figure 10C:
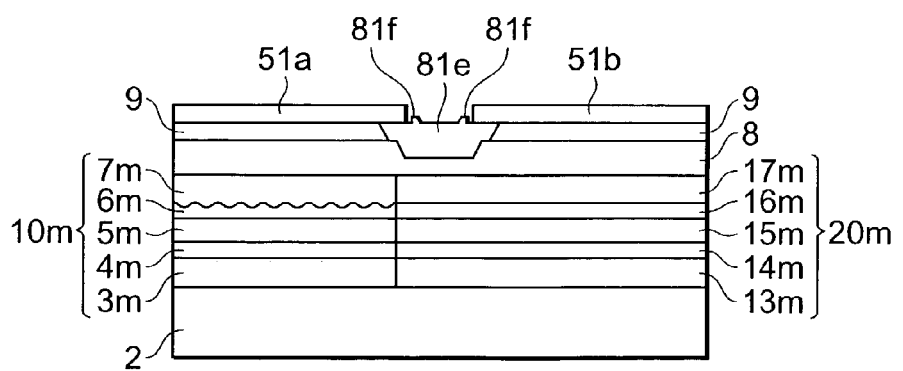

Next, the MOCVD method is used to bury depression portion 81d with n-type InP. Because the MOCVD method is used in formation, no gaps occur beneath the eave portions 51c, 51d, as shown in FIG. 10C. Also, a protrusion 81f is formed adjacent to the edges of third mask layers 51a, 51b. However, because eave portions 51c, 51d are long compared with eave portions 31c, 31d in the first aspect, protrusion 81f is small compared with protrusion 80f. That is, the surface of semiconductor embedded portion 81e is flat compared with semiconductor embedded portion 80e. As explained in the third aspect, similarly to semiconductor embedded portion 80e, a dopant such as Si may be added to semiconductor embedded portion 81e. Specifically, it is preferable that n-type impurity concentration in semiconductor embedded portion 80e be less than $5 \times 10^{17}$ cm$^{-3}$. Semiconductor embedded portion 80e may also comprise an unintentionally doped InP; in this case, n-type impurity concentration may be less than $1 \times 10^{14}$ cm$^{-3}$.

Figure 11A:
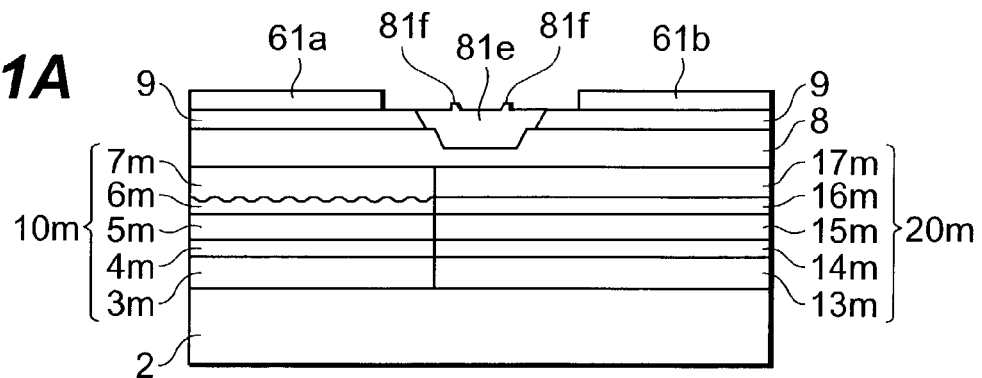

Next, after removal of third mask layers 51a, 51b, fifth mask layers 61a, 61b are formed to separate semiconductor embedded portion 81e and contact film 9, as shown in FIG. 11A. Fifth mask layer 61a covers the portion of contact film 9 which is to become contact layer 9a; fifth mask layer 61b covers the portion of contact film 9 which is to become contact layer 9b. The interval between fifth mask layers 61a, 61b can be made approximately 30 μm. Fifth mask layers 61a, 61b may comprise an insulating film such as SiN.

Figure 11B:
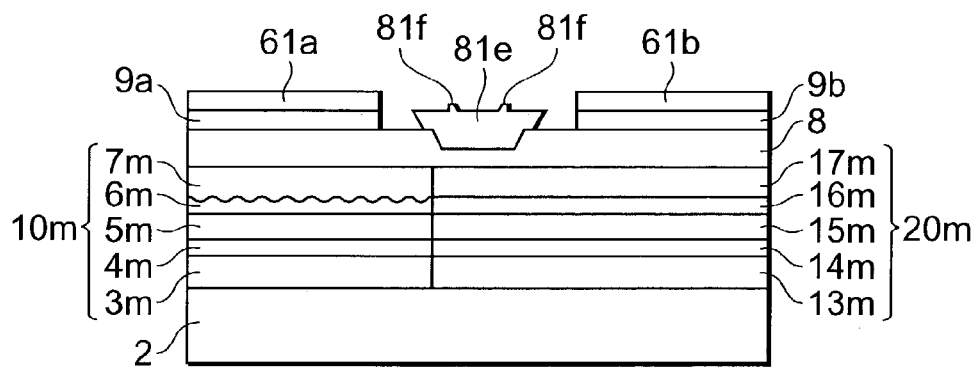
Figure 11C:
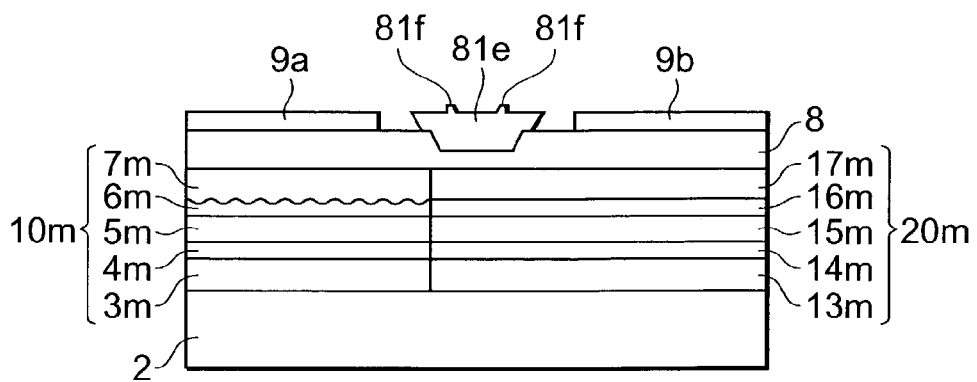

Etching is performed through fifth mask layers 61a, 61b, using phosphoric acid etching liquid. As shown in FIG. 11B, by means of this etching, contact film 9 comprising GaInAs is partially removed, and only the portion covered by fifth mask layers 61a, 61b remains. When fifth mask layers 61a, 61b are removed, contact layers 9a, 9b are obtained.

Thereafter, similarly to the third aspect, the principal mesa formation process and electrode formation process are executed to complete semiconductor optical integrated device 1.

In the manufacturing method of the fourth aspect, after formation of first clad films 7, 17, second clad film 8 comprising p-type InP and contact film 9 comprising p-type InGaAs are formed in order on top. Then, contact film 9 and second clad film 8 are etched, and depression portion 80d is formed in second clad film 8. Thereafter depression portion 80d is buried with n-type InP, to form semiconductor embedded portion 80e. Through this procedure, semiconductor embedded portion 80e can be formed. In semiconductor optical integrated device 1, semiconductor embedded portion 80e has the function of reducing the leakage current occurring between electrodes 90a, 90b via second clad layer 8m. Hence by means of the above manufacturing method, a semiconductor optical integrated device with reduced leakage current can be manufactured.

However, in the manufacturing method of the fourth aspect, when forming depression portion 80d, contact film 9 and second clad film 8 are etched continuously. At this time, contact film 9, comprising GaInAs, is side-etched. That is, this mask layer has long eave portions 51c, 51d. By means of these eave portions, when depression portion 80d is buried, the surface of semiconductor embedded portion 80e becomes more flat. Hence there is the advantage that stress occurring in passivation film 60 covering semiconductor embedded portion 80e is reduced.

EXAMPLE 1

Next, specific advantageous results of a semiconductor optical integrated device of this invention are explained, referring to examples. As Example 1, the inventors fabricated semiconductor optical integrated device A according to the method of manufacture of the third embodiment. In this semiconductor optical integrated device A, the n-type impurity concentration of semiconductor embedded portion 80e was $1 \times 10^{16}$ cm$^{-3}$.

EXAMPLE 2

Figure 12:
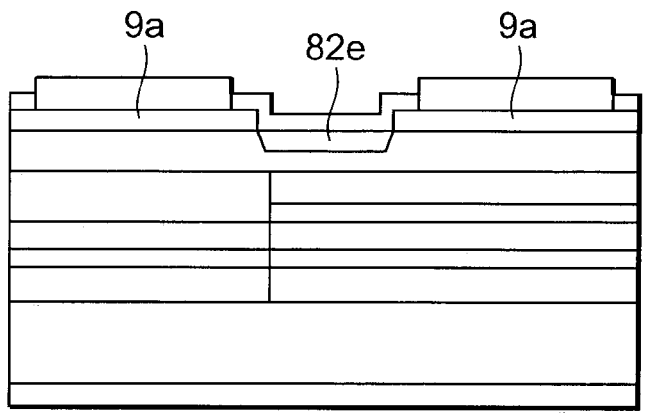
FIG. 12 is a drawing showing the shape of the semiconductor embedded portion in the semiconductor optical integrated device B of Example 2.

As Example 2, the inventors fabricated semiconductor optical integrated device B, the shape of the semiconductor embedded portion of which differed from that of semiconductor optical integrated device A of Example 1. FIG. 12 shows the shape of the semiconductor embedded portion in semiconductor optical integrated device B of Example 2. Referring to FIG. 12, in semiconductor optical integrated device B the edges of semiconductor embedded portion 82e touch contact layers 9a, 9b. The impurity concentration of semiconductor embedded portion 82e was $2 \times 10^{17}$ cm$^{-3}$. Except for the different shape of semiconductor embedded portion 82e, semiconductor optical integrated device B had the same configuration as semiconductor optical integrated device A.

COMPARATIVE EXAMPLE

As a comparative example, the inventors fabricated semiconductor optical integrated device C, in which neither semiconductor embedded portions 80e, 82e, nor narrow portion 50c were formed. Except for these differences semiconductor optical integrated device C had the same configuration as semiconductor optical integrated devices A and B.

Figure 13:
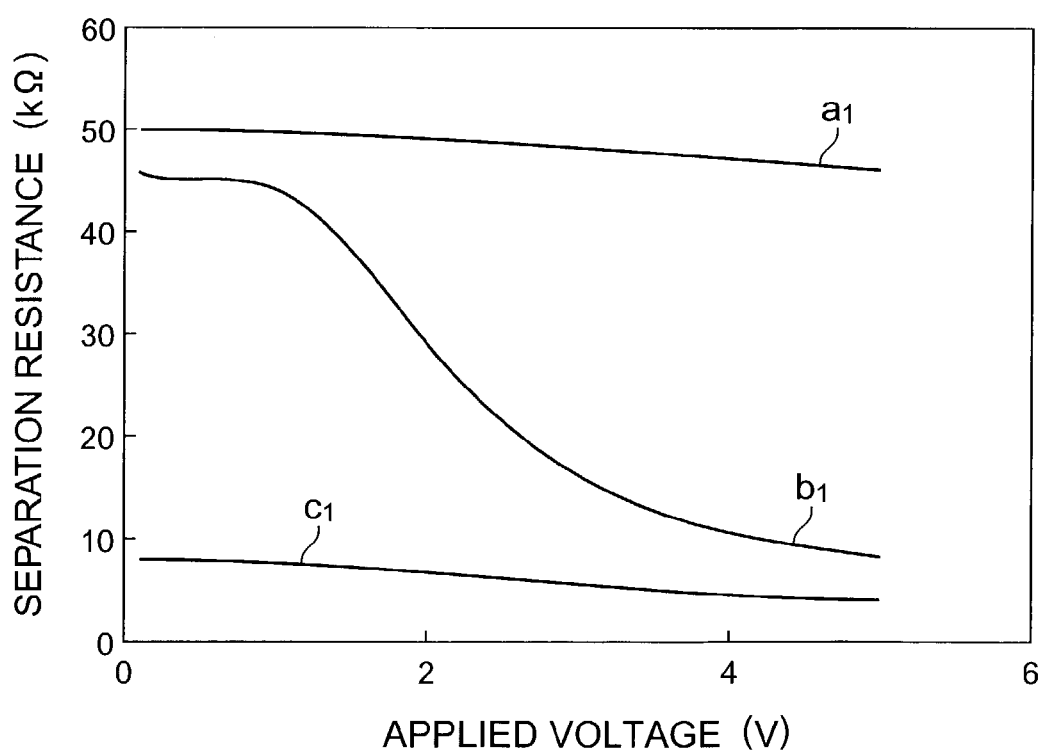
FIG. 13 is a graph showing the applied voltage dependence of the resistance between electrodes 90a and 90b; and, FIG. 14 is a graph showing the applied voltage dependence of the leakage current between electrodes 90a and 90b.

Next, measurement results for semiconductor optical integrated devices A, B and C are explained. FIG. 13 is a graph showing the applied voltage dependence of the resistance between electrodes 90a and 90b (hereinafter referred to as the "separation resistance"). In the figure, curves $b_1$, $c_1$ indicate experimental values for semiconductor optical integrated devices B and C respectively, and curve $a_1$ shows the results of simulations of semiconductor optical integrated device A. Referring to FIG. 13, in semiconductor optical integrated device C of the comparative example, the separation resistance is under 10 kΩ within the range of applied voltages for which measurements were performed. On the other hand, in semiconductor optical integrated device A of Example 1 the separation resistance is approximately 50 kΩ, quite high compared with semiconductor optical integrated device C. Moreover, in the case of semiconductor optical integrated device A there was almost no change in separation resistance even when the applied voltage was increased. In the case of semiconductor optical integrated device B, the separation resistance decreased with increasing applied voltage, but nonetheless remains high compared with semiconductor optical integrated device C of the comparative example. The inventors surmise that the reason for the decrease in separation resistance in the case of semiconductor optical integrated device B lies in the contact between semiconductor embedded portion 80e and contact layers 9a, 9b. As described above, contact layers 9a, 9b have a high p-type impurity concentration of approximately $1 \times 10^{18}$ cm$^{-3}$, and so it is inferred that the depletion layer formed at the interface with semiconductor embedded portion 80e is extremely thin. Hence it is inferred that as the voltage applied between electrodes 90a and 90b is raised, breakdown occurs at an interface between either of contact layers 9a, 9b and semiconductor embedded portion 80e, as a result of which the separation resistance drops.

Figure 14:
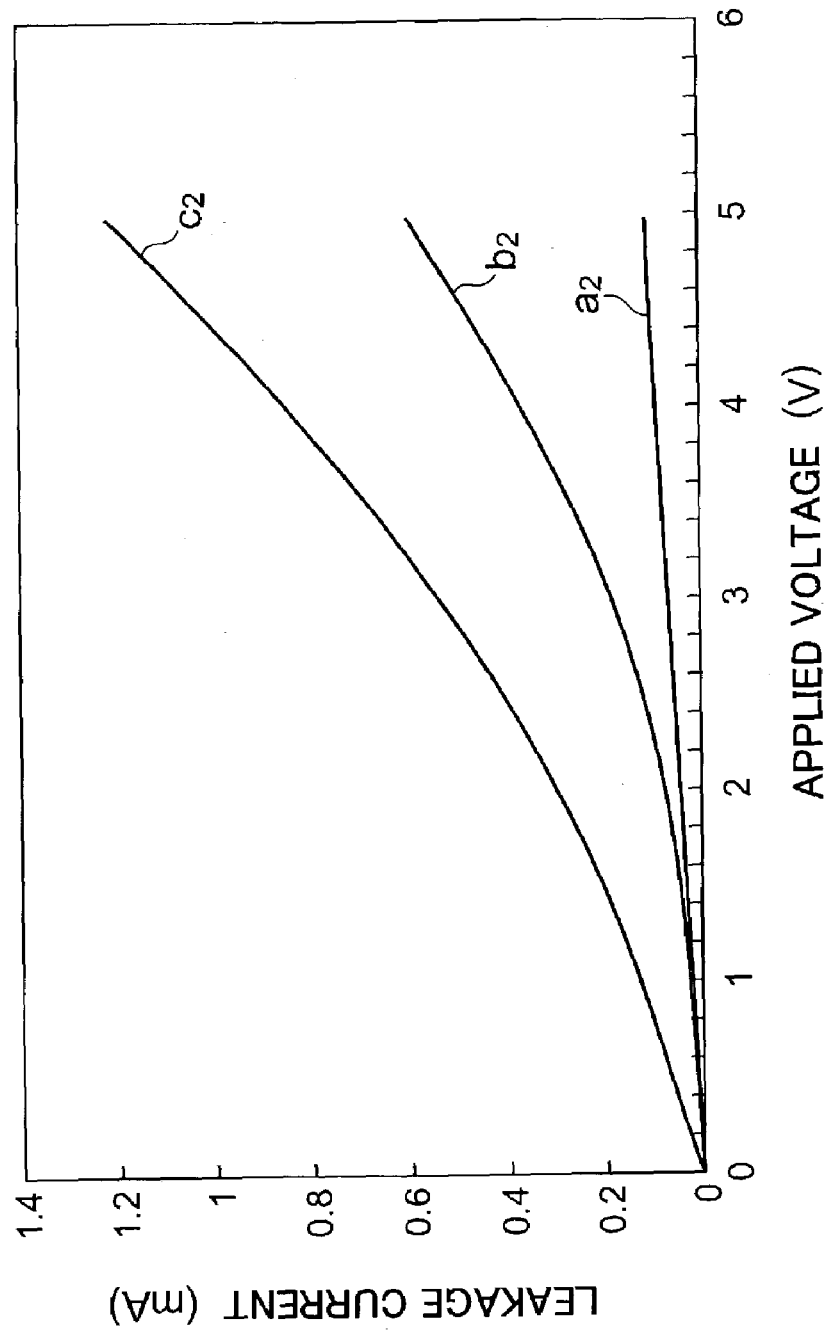

FIG. 14 is a graph showing the applied voltage dependence of the leakage current between electrodes 90a and 90b. In FIG. 14, curves $a_2$, $b_2$, $c_2$ are measurement results for semiconductor optical integrated devices A, B, C respectively. Referring to FIG. 14, in the case of semiconductor optical integrated device C the leakage current is prominent, at approximately 0.1 mA for an applied voltage of approximately 0.1 V, and reaching 1.2 mA when 5 V is applied. On the other hand, in the cases of semiconductor optical integrated devices A and B the leakage current is low compared with that for semiconductor optical integrated device C within the range of applied voltages for which measurements were performed. Particularly in the case of semiconductor optical integrated device A, a satisfactory result was obtained for the leakage current when 5 V was applied, at approximately $\frac{1}{10}$ that of semiconductor optical integrated device C. The advantageous results of Examples 1 and 2 are obvious from the above results.

In the above, semiconductor optical integrated devices and manufacturing methods for same of this invention have been explained, referring to a number of embodiments and examples; however, the present invention is not thereby limited, and various modifications are possible.

In the above embodiments and examples, semiconductor optical integrated devices were described having a narrow portion and semiconductor embedded portion 80e; however, a semiconductor optical integrated device of this invention may have only one of these. Even in a semiconductor optical integrated device not having a narrow portion 50c but having a semiconductor embedded portion 80e only, it is clear from the above explanation that the leakage current between electrodes 90a, 90b is reduced compared with a semiconductor optical integrated device having neither. And in a semiconductor optical integrated device not having a semiconductor embedded portion 80e but having a narrow portion 50c only, compared with a semiconductor optical integrated device in which neither is formed, clearly the leakage current will be reduced.

Also, a semiconductor optical integrated device having only a semiconductor embedded portion 80e, but not a narrow portion 50c, is manufactured by modifying the manufacturing method of the third embodiment as follows. That is, in the process of principal mesa formation of the third embodiment, in place of fourth mask layer 41b, a mask layer the width D of which is constant may be used.

On the other hand, a semiconductor optical integrated device having a narrow portion 50c but not having a semiconductor embedded portion 80e is manufactured by the manufacturing method of the third embodiment, omitting the process of formation of the semiconductor embedded portion. That is, after forming contact layers 9a, 9b in the contact film separation process, the principal mesa formation process may be performed.

A semiconductor optical integrated device according to the second embodiment, that is, a semiconductor optical integrated device having an electrode 90d on semiconductor embedded portion 80e of second clad layer 8m, can be manufactured as follows. That is, in the semiconductor optical integrated device manufacturing method of the third embodiment, an aperture may be provided in the portion of the resist mask, used in formation of electrodes 90a, 90b, which covers semiconductor embedded portion 80e. By this means, an electrode 90d is also formed in the process for formation of electrodes 90a, 90b.

In the above embodiments and examples, electrodes 90a, 90b may be provided directly on second clad layer 8m, without forming contact layers 9a, 9b. In this case, it is preferable that the impurity concentration in the surface portion of second clad layer 8m be adjusted so as to easily realize ohmic contact between electrodes 90a, 90b and second clad layer 8m.

As substrate 2, a p-type InP substrate may be used instead of an n-type InP substrate. In this case, the conductivity type of clad layer 3m is changed to p-type. The conductivity type of first clad layers 7m and 17m, and of second clad layer 8m, is also changed to n-type. Hence semiconductor embedded portion 80e must comprise p-type semiconductor.

Also, active layers 5m, 15m are not limited to MQW structures, but may comprise single quantum well structures. Also, a buffer layer may be provided between substrate 2 and clad layers 3m, 13m. And, the material of embedded layer 18 may be Fe-doped InP.

What is claimed is:

1. A semiconductor optical integrated device including a light-emitting element portion, a modulation element portion and a separation portion, said light-emitting element portion, said modulation element portion and said separation portion being arranged in a prescribed axial direction, said optical integrated device comprising:

a substrate;

a first optical waveguide provided in said light-emitting element portion and a second optical waveguide provided in said modulation element portion, said first and second optical waveguides being disposed on said substrate;

a first conductivity type semiconductor layer disposed on said first and second optical waveguides, said first and second optical waveguides and said first conductivity type semiconductor layer forming a principal mesa structure;

a first electrode electrically connected to said substrate;

a second electrode electrically connected to said first conductivity type semiconductor layer in said light-emitting element portion;

a third electrode electrically connected to said first conductivity type semiconductor layer in said modulation element portion; and an embedded semiconductor portion provided in said first conductivity type semiconductor layer in said separation portion, said embedded semiconductor portion extending along a direction intercepting said prescribed axial direction and being filled with a semiconductor material having a second conductivity type different to said first conductivity type.

2. The semiconductor optical integrated device according to claim 1, wherein a bottom of said embedded semiconductor portion is placed within said first conductivity type semiconductor layer.

3. The semiconductor optical integrated device according to claim 1, wherein said semiconductor material has a substantially same refractive index with said first conductivity type semiconductor layer.

4. The semiconductor optical integrated device according to claim 1, wherein said semiconductor material is InP.

5. The semiconductor optical integrated device according to claim 1, wherein a width of said principal mesa structure in said separation portion is smaller than a width of said principal mesa structure in at least one of said light-emitting element portion and said modulation element portion.

6. The semiconductor optical integrated device according to claim 1, wherein said semiconductor material includes an impurity with a concentration less than $5 \times 10^{17}$ cm$^{-3}$.

7. The semiconductor optical integrated device according to claim 1, wherein said semiconductor material includes an impurity introduced during an embedding process of said semiconductor material.

8. The semiconductor optical integrated device according to claim 1, wherein said semiconductor material is an undoped semiconductor.

9. The semiconductor optical integrated device according to claim 1, further provided a fourth electrode electrically connected to said embedded semiconductor portion.

10. The semiconductor optical integrated device according to claim 9, wherein said fourth electrode is electrically short-circuited to said second electrode such that said second and fourth electrodes are maintained at a same potential.

11. The semiconductor optical integrated device according to claim 1, further provides a first contact layer between said second electrode and said first conductivity type semiconductor layer in said light-emitting element portion and a second contact layer between said third electrode and said first conductivity type semiconductor layer in said modulation element portion.

12. The semiconductor optical integrated device according to claim 11, wherein the edges of said embedded semiconductor portion are at a distance from the edges of each of said first and second contact layers.

* * * * *